United States Patent [19]

Van Keulen et al.

[11] Patent Number: 5,146,189
[45] Date of Patent: Sep. 8, 1992

[54] OSCILLATOR CIRCUIT WITH VOLATGE CONTROLLED FREQUENCY

[75] Inventors: Eduard Van Keulen; Jan Ooijman, both of Doetinchem, Netherlands

[73] Assignee: U.S. Philips Corporation, New York, N.Y.

[21] Appl. No.: 748,495

[22] Filed: Aug. 22, 1991

[51] Int. Cl.$^5$ .............................. H03B 5/36
[52] U.S. Cl. ...................... 331/158; 331/44; 331/116 R; 331/177 V; 331/185
[58] Field of Search .................. 331/36 C, 44, 108 C, 331/116 R, 116 FE, 116 M, 117 R, 117 FE, 117 D, 158, 177 V, 185

[56] References Cited

U.S. PATENT DOCUMENTS 3,569,866  3/1971  Hearn ......................... 331/177 V X
3,815,052  6/1974  Watatani et al. ............... 331/117 R
3,911,378  10/1975  Buchanan ..................... 331/116 R

OTHER PUBLICATIONS

Cakulev, T. I. et al., "High-Performance Voltage-to-Frequency Converter" *Electronics Engineering;* Mar. 1969, pp. 346-348.

*Primary Examiner*—David Mis
*Attorney, Agent, or Firm*—Bernard Franzblau

[57] ABSTRACT

An oscillator circuit with a voltage controlled oscillator (VCO) comprises a range changing circuit that adapts the d.c. control voltage of the circuit to a control signal suitable for adjusting the VCO to the full frequency range. The voltage level for the control signal can be outside the voltage range delimited by the supply voltages for the circuit. In order to obtain a voltage supply of a sufficient voltage level the output signal of the VCO is used as the input of an a.c. to d.c. converter that provides the necessary higher supply voltage for the range changing circuit.

9 Claims, 2 Drawing Sheets

OSCILLATOR CIRCUIT WITH VOLATGE CONTROLLED FREQUENCY

FIELD OF THE INVENTION

The invention relates to an oscillator circuit, in particular to a voltage controlled oscillator circuit in which the oscillator is a crystal oscillator. Such an oscillator circuit finds application as a clock source in a large variety of electronic circuits, for example, in digital processors. A frequent application is in a phase locked loop, in which an oscillator signal is generated that is adapted to an external reference signal, for example a digital data signal.

BACKGROUND OF THE INVENTION

Voltage controlled oscillators or voltage to frequency convertors, i.e. oscillators in which the output frequency is determined by the level of an input voltage are well known. Examples of such oscillator circuits are disclosed in U.S. Pat. No. 3,815,052 and in U.S. Pat. No. 3,911,378. In U.S. Pat. No. 3,815,052 a phase in the feedback loop of the oscillator is changed in response to the external control voltage, the change in phase causing a change in the oscillation frequency of the oscillator. Also in U.S. Pat. No. 3,911,378 the oscillation frequency is controlled by changing the phase shift in the feedback loop. In the circuit of that document the phase shift is governed by resistor-capacitor circuits, in which the capacitor is a reverse biased diode of which the capacitance is a function of the voltage across the diode.

In such a circuit the range over which the output frequency of the oscillator circuit can be adjusted is limited by the maximum range of the control voltage. Normally the control voltage is derived from the supply voltage of the circuit, which means that the level of the control voltage is delimited by the levels of said supply voltage. Supply voltages often cannot be chosen at will, as they are standardized to make circuits compatible and to allow the use of standard power supply units. For many digital circuits the voltage supply is standardized at 0 (Ground) and +5 Volts. Use of non-standard power supply units may involve substantial additional costs and the provision of additional supply leads will take up extra space on a printed circuit board.

Due to voltage drops in the control circuitry, the standardized supply voltages of 0 and 5 Volts results in a smaller range for the control voltage, the range may be reduced to about 0.5 to 4.5 Volts or even to 1 to 4 Volts. In a number of applications this range is considered insufficient to provide the adjustment of the frequency necessary in that specific application. For example, in a phase locked loop used to derive a clock signal from a digital data signal, frequency jumps may occur in the data signal. The phase locked loop must be able to follow those jumps and therefore it needs a certain capture range to be able to follow the frequency jumps.

SUMMARY OF THE INVENTION

It is, inter alia, an object of the invention to provide an oscillator circuit in which the output frequency is adjustable outside the range delimited by the frequencies that correspond to a control voltage equal to the maximum and/or minimum levels of the supply voltages.

To this end, the invention provides an oscillator circuit comprising power supply terminals for receiving supply voltages at first and second voltage levels;

a voltage controlled oscillator (VCO) coupled to said power supply terminals, having an input for applying thereto a d.c. signal and an oscillator output for an oscillator output signal with a frequency related to said d.c. signal;

a control amplifier for generating a d.c. signal at a d.c. output thereof, which d.c. output is coupled to said input of the VCO, further having a control input for receiving a control signal and a supply input for receiving an additional supply voltage; and a power supply circuit for generating said additional supply voltage at an output coupled to said supply input of the control amplifier, the power supply circuit further having an input coupled to the oscillator output of the VCO. In this oscillator circuit the control signal that is applied to the oscillator circuit is transformed by a control amplifier to a d.c. voltage for control of the VCO. The control amplifier acts as a range changing circuit for the control signal. As the control amplifier is provided with an additional supply input to which a d.c. voltage is available that is not limited by the supply voltages, the d.c. signal can be adjusted to a more extended range of voltages. The additional supply voltage is generated by an a.c. to d.c. convertor from the oscillation signal at the output of the VCO. According to the invention this additional voltage is at a level outside the range of the supply voltages of the circuit.

It is remarked that it is known per se, from the article "High-performance voltage-to-frequency convertor" by T. I. Ĉakulev et al. in Electronics Engineering, March 1969, pages 346-348, to generate a d.c. voltage from the output of the VCO and to feed it back via an amplifier to the control signal of the VCO. However, in the known circuit the feedback is used as an error-signal to improve the accuracy of the oscillator circuit. In the present invention the d.c. voltage is used as an internal voltage source powering the control amplifier.

An advantage of the oscillator circuit according to the present invention is that the stability of the oscillator is maintained despite the extended frequency range.

In an advantageous embodiment the VCO is a voltage controlled crystal oscillator. Crystal oscillators are reliable oscillators with good frequency stability. The mentioned problem relates in particular, though not exclusively, to crystal oscillators because the physical constraints of the crystals involve the use of a considerable voltage change to obtain a certain frequency change. It is remarked that the term "crystal" referred to herein is meant to include natural and artificial crystals, such as quartz, and also ceramic materials that possess the property of piezo-electricity, such as lithiumniobate.

In an embodiment of the oscillator circuit according to the invention the voltage controlled crystal oscillator comprises a diode with variable capacitance placed in series with the crystal. This series arrangement of crystal and variable capacitance provides a simple adjustable frequency selective circuit. The oscillation frequency is tuned by adjusting the voltage across the diode.

In another embodiment of the oscillator circuit according to the invention the voltage controlled oscillator is of the Colpitts type. A Colpitts oscillator is a well-known and stable oscillator that is easily adjustable to a whole range of frequencies. It is further suitable for this application because the a.c. voltage across the crystal can be low as to maintain the diode in its reverse biased state. As the amplifier in a Colpitts oscillator is a transistor this oscillator is suitable for use in an integrated circuit.

In an embodiment of the oscillator circuit the power supply circuit comprises a plurality of diodes arranged in series between one of the power supply terminals and the power supply output, a node between two diodes being coupled via a capacitance to the oscillator output of the VCO and a terminal of at least one of said two diodes away from said node being coupled via another capacitance to the other of the two power supply terminals. Such a circuit provides a voltage at the storage capacitance that exceeds the voltage difference at the power supply terminals with the full amplitude of the output signal of the VCO. The storage capacitance is recharged every cycle of the VCO. The power supply circuit may comprise a plurality of such circuits arranged in a cascade to increase the output voltage.

In an advantageous embodiment of the oscillator circuit according to the invention the control amplifier circuit comprises first calibration means for adjusting the oscillation frequency of the VCO at a nominal value of said control signal and/or second calibration means for adjusting the ratio between a change in the level of the control signal and a corresponding change in the oscillation frequency. By use of this first and second calibration means the frequency and the derivative of the frequency with respect to the control voltage can be easily calibrated to nominal values. The quantity that is changed, the d.c. signal generated by the control amplifier, exists only inside the oscillator circuit and, consequently, the calibration does not effect any voltage levels or circuitry outside the oscillator circuit. At the same time the accuracy of the invented oscillator circuit is improved due to the independent calibration of slope and offset.

These, and other more detailed aspects of the invention will now be elucidated by way of example with reference to the accompanying drawings.

DETAILED DESCRIPTION OF THE DRAWINGS

Figure 1:
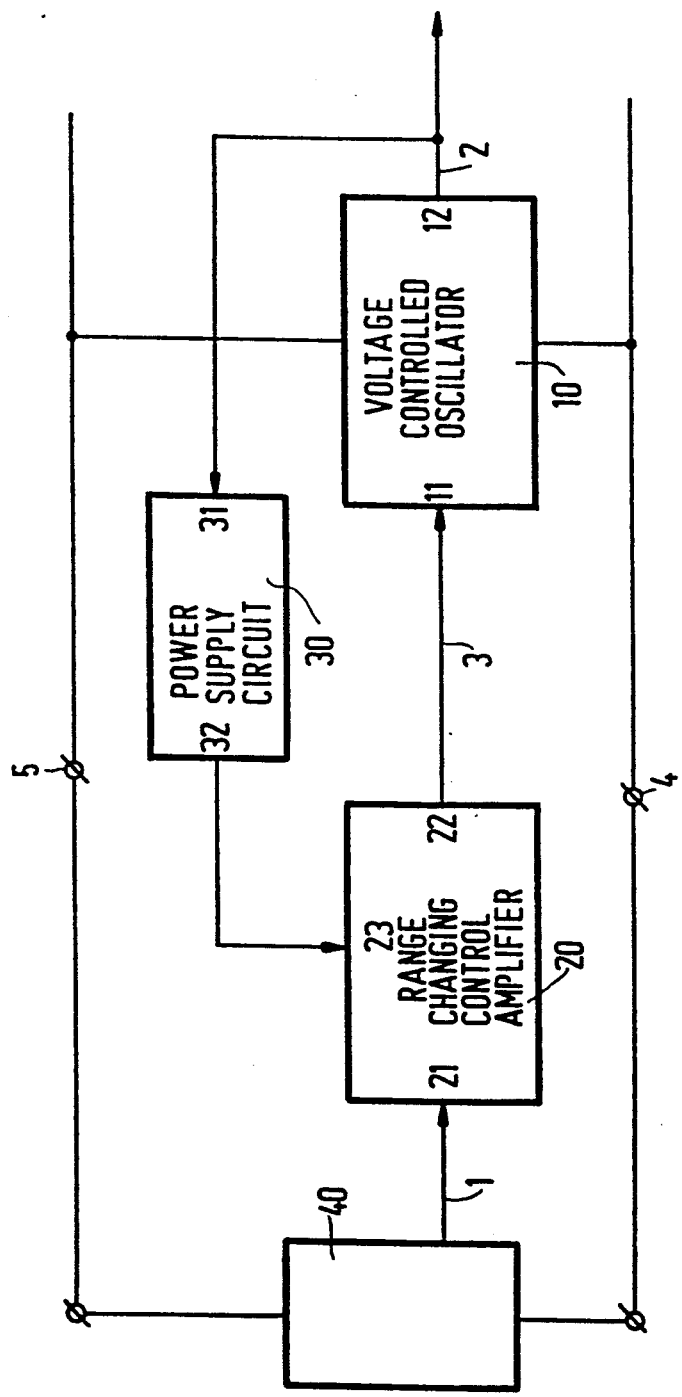
FIG. 1 shows diagrammatically an oscillator circuit according to the invention.

In FIG. 1 a voltage controlled oscillator (VCO) 10 is indicated. The VCO 10 comprises a control input 11 for a d.c. control signal 3 and an output 12 for an a.c. output signal 2. The oscillation frequency of the output signal 2 is related to the voltage level of the d.c. control signal 3. To supply power to the VCO 10 it is connected to two power supply terminals 4 and 5, respectively. The first voltage supply terminal 4 is, for example, ground (0 V) and the second power supply terminal 5 is at a standardized level of, for example, +5 V. These standardized voltages of 0 and 5 V are available throughout the complete circuit arrangement of which the oscillator circuit of FIG. 1 forms a portion.

The d.c. control signal 3 is obtained from the output 22 of a control amplifier 20. The control amplifier has an input 21 to which a d.c. control voltage is applied originating from an external circuit 40, the latter not being a portion of the oscillator circuit. As the maximum supply voltages at the external circuit 40 are the standardized voltages available at the power supply terminals 4 and 5, the value of the control voltage 1 is delimited by the voltage levels thereof. In an actual circuit the range of control voltage 1 will be even less as some voltage drop is inevitable while generating the control voltage.

To overcome this limit and to generate a d.c. control signal for the VCO that can have a value outside the range delimited by the voltages at the supply terminals 4 and 5, the control amplifier is provided with an additional input 23 to which a higher d.c. voltage is applied. The control amplifier converts the control voltage at its input 21 to a d.c. control signal in a range delimited by the higher additional supply voltage at input 23. Thereby the frequency range that can be reached by the VCO is extended. The additional supply voltage is generated in a power supply circuit 30, of which an input 31 is coupled to the output 12 of the VCO, and which power supply circuit generates a d.c. voltage of, for example, 12 V at its output 32.

Figure 2:
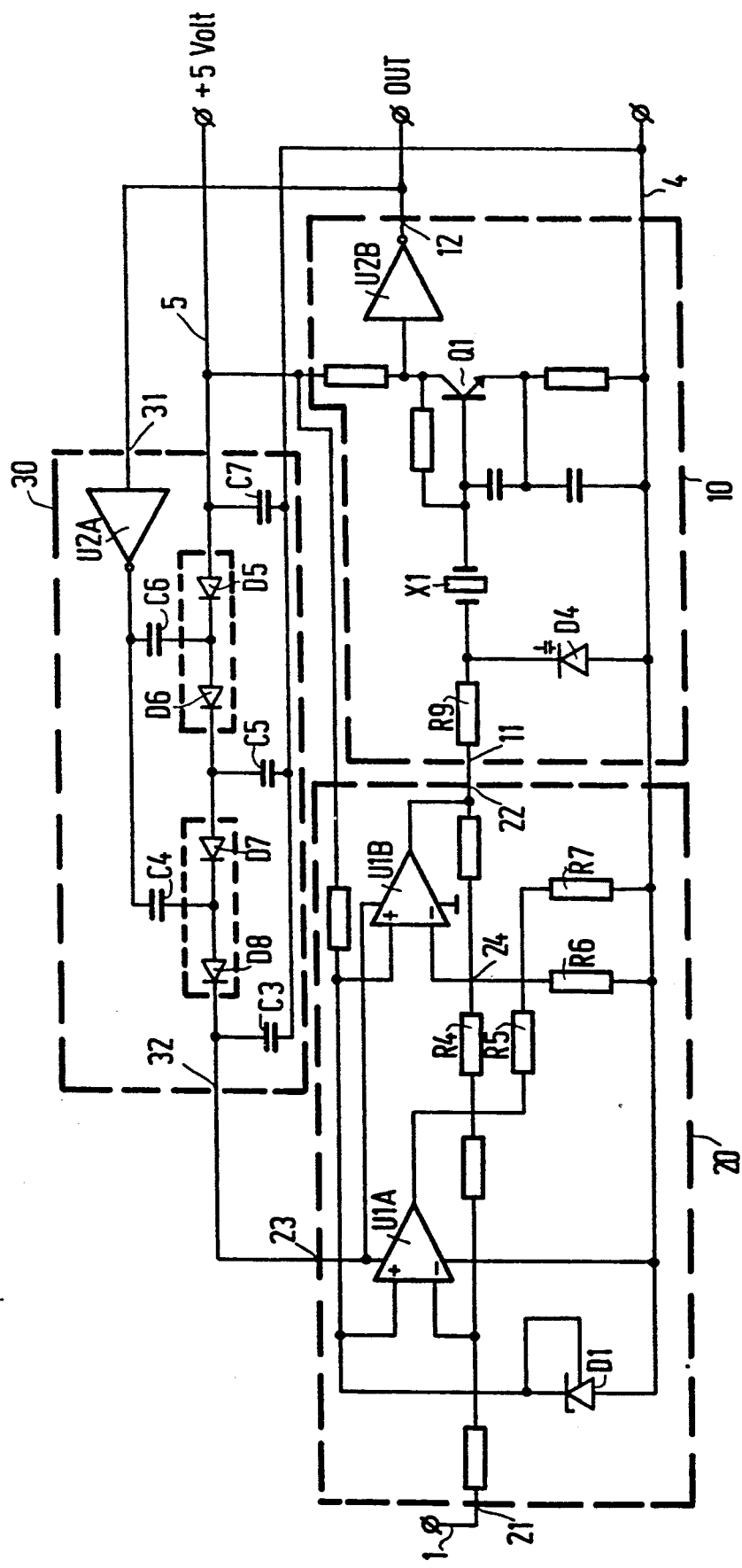
FIG. 2 shows a circuit diagram of a preferred embodiment in which the VCO is a Colpitts type crystal oscillator.

In FIG. 2 the circuit of an embodiment of the invented oscillator circuit is shown diagrammatically. In this diagram the VCO 10 is an emitter coupled Colpitts oscillator in which a crystal X1 is used as the frequency selective element. In series with the crystal X1 is a diode D4 with variable capacitance, its cathode being connected to the crystal X1 and its anode to ground at the first power supply terminal 4. As the control input 11 of the VCO is coupled, via a decoupling resistor R9, to the junction point between the diode D4 and the crystal X1, the diode D4 is always reverse biased and acts exclusively as a variable capacitance influencing the resonance frequency of the VCO 10. In alternative embodiments other types of oscillators, such as Pierce or Clapp oscillators, or other embodiments of the Colpitts oscillator can be used as well. The output signal of the VCO is derived from the collector of the transistor Q1 via an invertor U2B and made available at the oscillator output 12. The invertor U2B functions as an output buffer or pulse shaper for the oscillator signal.

The oscillator output 12 of the VCO 10 is connected to the input 31 of the power supply circuit 30. The power supply circuit 30 acts as an a.c. to d.c. convertor and consists of two identical sub-circuits placed in series. Each sub-circuit comprises two diodes placed in series D5, D6 and D7, D8, respectively. The node between the two diodes being coupled via the decoupling capacitances C6 and C4 and the buffer U2A with the input 31. In the first sub-circuit the anode of the first diode D5 is coupled to a decoupling capacitance C7, and the cathode of the second diode D6 is connected to a storage capacitance C5, the other terminals of the capacitances C7 and C5 are connected to ground. The second sub-circuit also comprises an input capacitance C5 and a storage capacitance C3 connected in the same way, the storage capacitance C5 of the first circuit being identical to the input capacitance C5 of the second circuit.

Because of their similarity the operation of each of the sub-circuits will be described with reference to the first sub-circuit (C5, C6, C7, D5 and D6) only. As a starting point it is assumed that the voltage at the input 31 is such that the voltage at the terminal of decoupling capacitance C6 away from the diodes D5 and D6 is zero and falling, i.e. the a.c. signal at the output of invertor U2A is at the cross-over point from positive to negative. The decoupling capacitance C7 is charged to about 5 V, the supply voltage. When the voltage at the output of U2A drops below zero, the voltage at the node between the diodes D5 and D6 drops below 5 V, the diode D5 becomes conductive and charge flows from the terminal 5 to said node, where it is accumulated at capacitance C6. Consequently, the voltage at the node drops substantially less than the amplitude of the a.c. signal at the output of the buffer U2A. When the a.c. signal rises again later in the cycle the voltage at the node between the diodes rises above 5 V and diode D5 switches off. When the voltage rises further it exceeds the voltage at storage capacitance C5 and diode D6 becomes conductive. The charge accumulated in the capacitance C6 flows into the storage capacitance C5, raising the voltage at that capacitance. When, still further in a cycle the level of the a.c. signal drops again, the voltage at the node drops as well and the diode D6 becomes non-conductive. By repeating this sequence, eventually the voltage at capacitance C5 is raised above the voltage at supply terminal 5 by an amount that corresponds substantially to the peak-peak amplitude of the output signal of the VCO. Due to losses and the forward voltage drop in the diodes the full value of the peak-peak amplitude is never reached. The second sub-circuit (C3, C4, C5, D7 and D8) increases the voltage at its storage capacitance C3 by a similar amount relative to the voltage at capacitance C5. If necessary, further identical sub-circuits can be used to obtain additional voltage increases. Consequently, at the output 32 of the power supply circuit a voltage is available that is substantially higher than the voltage at the power supply terminal 5.

This higher voltage is used as a supply voltage in the control amplifier 20. The control amplifier comprises two cascaded differential amplifiers U1A and U1B, powered from the power supply 30. The voltage at the power supply terminal 5 is used as a reference voltage for these amplifiers and stabilized by a voltage reference circuit D1 at, for example, 2.5 Volts. In the first differential amplifier U1A the control voltage is compared with the reference voltage and an output current is generated that is proportional to the difference between the two voltages. The resistors R4, R5, R6 and R7 provide a voltage divider creating at node 24 a voltage level that is applied to the second differential amplifier U1B. The input of the second differential amplifier is the voltage at this node 24 and the stabilized supply voltage. The output of the second differential amplifier is the output of the control amplifier.

The voltage divider with resistors R4 and R5 in its first branch and resistors R6 and R7 in its second branch allows an easy calibration of the oscillator circuit. By adjusting resistor R5, or R4, the amplification of the control amplifier can be set, i.e. the pullability of the oscillator circuit can be adapted to compensate for production tolerances. Resistor R7, or R6, can be used to adjust the nominal frequency. In the described embodiment two inverting differential amplifiers are used whereby a change of the values of the calibration resistances leads to no change of the input impedance of the control amplifier. Additionally, the presence of two differential amplifiers allows a fully independent calibration of pullability and nominal frequency.

Without deviating from the main idea of the invention, other types of power supply circuits can be used for generating the additional supply voltage, such as a Cockcroft-Walton or Villard type of cascaded circuit, or for adapting the voltage of the oscillator circuit to the required control range for the VCO.

We claim:

1. An oscillator circuit comprising
power supply terminals for receiving supply voltages at first and second voltage levels;
a voltage controlled oscillator (VCO) coupled to said power supply terminals, and having an input for applying thereto a d.c. signal and an oscillator output for an oscillator output signal of a frequency related to said d.c. signal;
a control amplifier for generating a d.c. signal at a d.c. output thereof, which d.c. output is coupled to said input of the VCO, further having a control input for receiving a control signal and a supply input for receiving an additional supply voltage; and
a power supply circuit for generating said additional supply voltage at an output coupled to said supply input of the control amplifier, the power supply circuit having an input coupled to the oscillator output of the VCO.

2. An oscillator circuit according to claim 1, wherein the VCO is a voltage controlled crystal oscillator (VCXO) comprising a piezo-electric crystal as a frequency selective element.

3. An oscillator circuit according to claim 2, wherein, for adjusting the oscillation frequency, the VCXO comprises a diode with variable capacitance placed in a series with the crystal.

4. An oscillator circuit according to claim 1, wherein the additional supply voltage has a voltage level outside the range delimited by said first and second voltage levels.

5. An oscillator circuit according to claim 1, wherein the voltage controlled oscillator is of the Colpitts type.

6. An oscillator circuit according to claim 1, wherein said power supply circuit comprises a plurality of diodes connected in series between one of the power supply terminals and its output, a node between two diodes being coupled via a capacitance to the oscillator output of the VCO and a terminal of at least one of said two diodes away from said node being coupled via another capacitance to the other of the two power supply terminals.

7. An oscillator circuit according to claim 1, wherein the control amplifier circuit comprises first calibration means for adjusting the oscillation frequency of the VCO at a nominal value of said control signal.

8. An oscillator circuit according to claim 1, wherein the control amplifier comprises calibration means for adjusting the ratio between a change in the level of the control signal and a corresponding change in the oscillation frequency.

9. An oscillator circuit according to claim 1, wherein the control amplifier comprises first calibration means for adjusting the oscillation frequency of the VCO at a nominal value of said control signal and second calibration means for adjusting the ratio between a change in the level of the control signal and a corresponding change in the oscillation frequency, said second calibration means being independent of said first calibration means.

* * * * *